United States Patent
Butzmann

(10) Patent No.: US 10,024,921 B2
(45) Date of Patent: Jul. 17, 2018

(54) BATTERY MANAGEMENT SYSTEM, BATTERY, MOTOR VEHICLE HAVING A BATTERY MANAGEMENT SYSTEM, AND METHOD FOR MONITORING A BATTERY

(75) Inventor: Stefan Butzmann, Beilstein (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 461 days.

(21) Appl. No.: 14/131,637

(22) PCT Filed: Jul. 6, 2012

(86) PCT No.: PCT/EP2012/063215
§ 371 (c)(1),
(2), (4) Date: Apr. 11, 2014

(87) PCT Pub. No.: WO2013/007617
PCT Pub. Date: Jan. 17, 2013

(65) Prior Publication Data
US 2014/0212714 A1      Jul. 31, 2014

(30) Foreign Application Priority Data
Jul. 14, 2011  (DE) .................. 10 2011 079 126

(51) Int. Cl.
*H01M 10/48*  (2006.01)
*H01M 10/42*  (2006.01)
(Continued)

(52) U.S. Cl.
CPC ........ *G01R 31/3606* (2013.01); *B60L 3/0046* (2013.01); *B60L 3/0092* (2013.01);
(Continued)

(58) Field of Classification Search
CPC ... H01M 10/42; H01M 10/48; B60L 11/1864; B60L 3/0046; B60L 3/0042
See application file for complete search history.

(56) References Cited

U.S. PATENT DOCUMENTS

| | | | |
|---|---|---|---|
| 2003/0228503 A1 | 12/2003 | Georgii | |
| 2009/0208818 A1* | 8/2009 | Poff | H01M 2/1066 429/50 |

(Continued)

FOREIGN PATENT DOCUMENTS

| | | |
|---|---|---|
| DE | 102 18 669 A1 | 11/2003 |
| DE | 10 2004 008 935 A1 | 9/2005 |

(Continued)

OTHER PUBLICATIONS

International Search Report corresponding to PCT Application No. PCT/EP2012/063215, dated Dec. 13, 2013 (German and English language document) (7 pages).

(Continued)

*Primary Examiner* — Kenneth J Douyette
(74) *Attorney, Agent, or Firm* — Maginot, Moore & Beck LLP

(57) ABSTRACT

A battery management system includes several first measuring units, each associated with at least one respective battery module of the battery to detect a measured variable. The battery management system also includes a control device having a first microcontroller and a second microcontroller, a first communication connection configured to transfer data between the first measuring units and the control device, and several second measuring units configured to detect the measured variable from the battery modules of the battery in addition to the detection of the measured variable by the first measuring units. A second communication connection is used to transfer data between the second measuring units and the control device. The first microcontroller is config- (Continued)

ured to evaluate measurement data detected by the first measuring units, and the second microcontroller is configured to evaluate measurement data detected by the second measuring units independently of the first microcontroller.

13 Claims, 4 Drawing Sheets

(51) Int. Cl.
*G01R 31/36* (2006.01)
*B60L 3/00* (2006.01)
*B60L 11/18* (2006.01)
*B60L 3/04* (2006.01)

(52) U.S. Cl.
CPC .............. *B60L 3/04* (2013.01); *B60L 11/1864* (2013.01); *H01M 10/42* (2013.01); *H01M 10/48* (2013.01); *B60L 2240/545* (2013.01); *B60L 2240/547* (2013.01); *B60L 2240/549* (2013.01); *H01M 2010/4271* (2013.01); *H01M 2220/20* (2013.01); *Y02T 10/7011* (2013.01); *Y02T 10/7061* (2013.01); *Y02T 90/16* (2013.01)

(56) References Cited

U.S. PATENT DOCUMENTS

2011/0089897 A1* 4/2011 Zhang ................... H02J 7/0016
  320/116
2011/0144840 A1* 6/2011 Ye ............................ B60K 6/46
  701/22

FOREIGN PATENT DOCUMENTS

DE   10 2009 046 567 A1   5/2011
WO   2008/053365 A2      5/2008
WO   2009/158367 A2     12/2009

OTHER PUBLICATIONS

Atmel Corporation; Li-Ion, NiMH Battery Measuring, Charge Balancing and Power-supply Circuit ATA6870 Preliminary; www.DataSheet4U.com; Oct. 2009; 55 Pages.
Atmel Corporation; Li-ion Battery Management Monitoring Emergency and Backup Circuit ATA6871; www.DataSheet4U.com; Jul. 2009; 23 Pages.
Claus Mochel; 5Safety First: Ein Muss fur Li-lonen-Batterien; www.all-electronics.de; Dec. 2009; Page 25.

* cited by examiner

BATTERY MANAGEMENT SYSTEM, BATTERY, MOTOR VEHICLE HAVING A BATTERY MANAGEMENT SYSTEM, AND METHOD FOR MONITORING A BATTERY

This application is a 35 U.S.C. § 371 National Stage Application of PCT/EP2012/063215, filed on Jul. 6, 2012, which claims the benefit of priority to Serial No. DE 10 2011 079 126.4, filed on Jul. 14, 2011 in Germany, the disclosures of which are incorporated herein by reference in their entirety.

The present disclosure relates to a battery management system, a battery having the battery management system, a motor vehicle having the battery management system and a method for monitoring a battery. In particular, the disclosure relates to a battery management system and an associated method for ascertaining and evaluating at least one measured variable for battery cells or battery modules.

BACKGROUND

It is apparent that in future both static applications, such as wind power installations, in vehicles, such as in hybrid and electric vehicles, and in the consumer sector, such as in the case of laptops and mobile telephones, will make increasing use of new battery systems, on which very high demands in terms of the reliability, safety, performance and life thereof are placed.

Batteries with lithium ion technology are particularly suited to such tasks. They are distinguished by high energy density and low self-discharge, inter alia. By definition, lithium ion batteries comprise two or more lithium ion cells that are interconnected. Lithium ion cells can be interconnected by virtue of parallel or serial interconnection to form modules, and then to form batteries. Typically, a module comprises six or more cells.

DE 102009046567 A1 discloses a battery that is constructed from a plurality of battery modules, wherein the battery modules are monitored by means of a central battery management system.

As shown in FIG. 1, a conventional battery system 10 may have a battery management system 11 with a central controller 15, which communicates with a plurality of cell monitoring units 16 ("Cell Supervision Circuit"; CSC) that are each associated with a plurality of battery cells 14 or battery modules. In the text below, depending on the context, all of the battery cells 14 arranged in battery modules, with or without the associated battery management system 11, can be referred to as a battery. The battery cells 14 are grouped into battery modules, the precise split of the battery cells into the battery modules not being shown in FIG. 1. The battery management system 11 may be accommodated with battery cells 14 or battery modules in a shared housing (not shown). The battery modules may each have a separate housing. Arrangement of the battery cells 14 in battery modules can be used to achieve better scalability. In order to monitor the correct operation of the battery cells 14, the battery cells are monitored by the plurality of CSCs 16. In this case, a CSC 16 typically has two respective battery modules associated with it. A CSC 16 contains measuring electronics that monitor the voltage and further parameters. The information obtained by means of the CSC 16 is sent via a communication bus 18, for example a CAN bus, to a central controller 15 that evaluates the data from all battery cells 14 and, in the event of deviations from defined parameters, takes corrective action or if necessary opens the contactors 17, 19 and disconnects the battery system 10.

The controller 15 has a low voltage side or a low-voltage-side portion 22 with a microcontroller 23 and a high voltage side or a high-voltage-side portion 24 with a microcontroller 25. The low voltage side 22 and the high voltage side 24 are connected to one another via DC isolation 29. The low voltage side 22 is connected to a Hall sensor 27 for measuring the battery current, with the high voltage side 24 being connected to a shunt 26 for measuring the battery current. The controller 15 communicates with the vehicle electronics by means of the bus 28. The electrical connections 12, 13 are used for supplying power for a motor vehicle, for example, and/or for recharging the battery.

A further topology for cell monitoring is shown in FIG. 2. In this case, the CSCs 16 transfer their information via a daisy chain 32. A CSC 16 does this by routing its data packet to the next, which adds its information and in turn forwards it to the next CSC 16. Each CSC 16 contains a cell voltage measuring unit 21 (CVM). The line comprising the CSCs 16 arranged in daisy chain topology is in turn connected to the controller 15.

The monitoring of the cell voltages and also of the currents and the temperature for transgression of particular limit values is an essential safety factor in a battery system. ISO standards, particularly ISO 26262: Functional safety for E/E systems in motor vehicles, require a certain safety level ASIL (automotive safety integrity level) to be achieved.

In order to ensure functional safety for the battery system 10, the data from the CSCs 16 are evaluated and compared with one another both on the high voltage side 24 and on the low voltage side 22 of the controller 15 in the two redundant microcontrollers 23, 25. In this case, the high-voltage-side microcontroller 25 uses the total voltage of the pack, that is to say of all battery modules, and the total current that is measured by means of the shunt 26, for example. The low-voltage-side microcontroller 23 measures the voltage of the individual battery cells 14 and also the current that is ascertained via the Hall sensor 27, for example.

Current and voltage need to be checked at the same instant in order to be able to calculate plausible values. In order to be able to compare the values from the high voltage side 24 and the low voltage side 22, these data also need to be ascertained in parallel. In order to obtain a synchronous data base, the controller therefore simultaneously sends requests via the communication bus 18 to the CSCs 16, Hall sensors 27 and the shunt 26, which are then reported back, ideally simultaneously.

In order to comply with the high ASIL level, the controller has numerous security and control functions that include self-monitoring of the controller 15, inter alia. In addition, the controller monitors the CSCs 16. In order to uphold the high ASIL level, the controller 15 needs to undergo elaborate programming in order to be able to calculate the plausibility of the CSC data and thus to ensure the necessary functional safety. The data are captured by the same CSCs 16 both for the high-voltage-side microcontroller 25 and for the low-voltage-side microcontroller 23 of the controller 15. The controller needs to synchronize both microcontrollers 23, 25 to one another.

However, the synchronization of the data presents a problem that can be solved only with a high level of involvement. For example, the measuring electronics never report back data in precise synchronism, which means that values from different instants, for example the voltage from a CSC 16 with the current from the shunt 26 or from the Hall sensors 27, are offset against one another. Furthermore, these values are also compared with asynchronous values when the values calculated in the high-voltage-side microcontroller 25 are compared with the values calculated in the low-voltage-side microcontroller 23. The resultant discrepancies need to be corrected with a high level of computation involvement in the controller 15, which entails a high level of software involvement. Very complex computation models need to be applied in order to plausibilize the safety of the system, and these have to undergo elaborate programming. Known topologies for monitoring battery cells require a high level of functional safety and hence a high ASIL level and therefore not a low level of software involvement.

SUMMARY

A battery management system and an associated method in accordance with the description below are provided.

According to the disclosure, a battery management system has a plurality of first measuring units for capturing a measured variable that are each associated with at least one battery module of the battery. In addition, the battery management system has a controller having a first microcontroller and a second microcontroller and has a first communication link for transmitting data between the first measuring units and the controller, and also has a plurality of second measuring units for capturing the measured variable from the battery modules of the battery, in addition to the capture of the measured variable by the first measuring units. A second communication link is used for transmitting data between the second measuring units and the controller. The first microcontroller is set up to evaluate measurement data captured by the first measuring units, and the second microcontroller is set up to evaluate measurement data captured by the second measuring units independently of the first microcontroller.

The method according to the disclosure for monitoring a battery fundamentally comprises: capture of a measured variable from measurements on battery cells or battery modules of the battery, wherein measuring units are used that are arranged in different groups such that the measured variable for in each case one or more battery modules is ascertained repeatedly and independently of one another. Hence, a method is provided in which a first step involves information being obtained from battery cells or battery modules by means of the first line of first measuring units according to the disclosure and a second step involves the required measurements being performed repeatedly or simultaneously by using other appliances, namely by means of the second line of second measuring units according to the disclosure. However, the measurements for the two lines preferably take place simultaneously, or the lines are actuated at least simultaneously.

An advantage of the battery management system according to the disclosure is that the software involvement can be reduced and difficulties in the synchronization of the data disappear, since two CSC lines acting independently of one another are available. A battery management system having increased hardware redundancy is provided in which the CSCs are advantageously arranged. In addition, increased functional safety is therefore provided, with redundancies for the CSCs, the communication bus and the microcontrollers being provided in the controller. Synchronization between a high-voltage-side microcontroller and a low-voltage-side microcontroller is no longer necessary, or is necessary only to a minimum extent, which means that simpler programming of the controller suffices.

Advantageous developments of the disclosure are specified and described in the description.

In accordance with one advantageous embodiment, the first microcontroller is also set up to perform the evaluation of the measurement data captured by the first measuring units independently of the second microcontroller. This allows the safety to be increased further.

The communication by the separate CSC lines with the controller can proceed optionally using CAN and CAN, that is to say by means of a CAN bus both on the high voltage side and on the low voltage side, using CAN and daisy chain, using daisy chain and CAN or using daisy chain and daisy chain.

This provides increased flexibility. The disclosure is not limited to a particular communication system but rather can be customized in suitable fashion according to need and application.

In accordance with one exemplary embodiment of the disclosure, the first measuring units and/or the second measuring units are each connected to the first and/or the second communication link via an interposed cell monitoring microcontroller.

As a result, it is advantageously possible to continue to ensure a high ASIL level and to increase the functional safety further.

In accordance with another exemplary embodiment, a respective one of the first measuring units is arranged in a first cell monitoring unit, with one of the second measuring units being arranged in a second cell monitoring unit, which is different than the first cell monitoring unit, such that the first and second cell monitoring units are each coupled to the same battery modules of the battery.

This arrangement provides increased symmetry and can therefore reduce programming involvement, for example.

In accordance with yet another exemplary embodiment, a respective one of the first measuring units together with one of the second measuring units are arranged in a cell monitoring unit, wherein the cell monitoring unit captures at least one further physical measured variable for the battery cells or battery modules in addition to the measured variables monitored by the first and second measuring units.

In this advantageous example, a very compact configuration can be achieved in which hardware redundancy is selectively limited to particular important parameters.

In accordance with yet another exemplary embodiment of the disclosure, the first microcontroller is arranged on a low voltage side of the controller and the second microcontroller is arranged on a high voltage side of the controller, said sides being DC isolated from one another.

An advantage of this is that high voltage monitoring can be made simpler, since the high voltage side no longer has the state of charge (SOC) determined, but rather merely undertakes a safety function.

In addition, the disclosure provides a battery having a battery management system as described below.

According to one preferred exemplary embodiment, the battery is a lithium ion battery.

In addition, a motor vehicle having the battery management system according to the disclosure is provided, wherein the battery to be monitored is connected to a drive system of the motor vehicle.

Preferably, the measured variable is an electrical voltage. This advantageously means that both the battery voltage and the state of charge SOC can be monitored in combination with a current measurement by current sensors in the battery management system.

However, the disclosure is not limited thereto. Even if the use of the disclosure for ascertaining battery-internal voltages is particularly advantageous, use for ascertaining other measured variables, such as a temperature, etc., is also possible according to the respective requirements.

BRIEF DESCRIPTION OF THE DRAWINGS

Exemplary embodiments of the disclosure are explained in more detail by means of the drawings and the description below. In the drawings.

DETAILED DESCRIPTION

Figure 1:
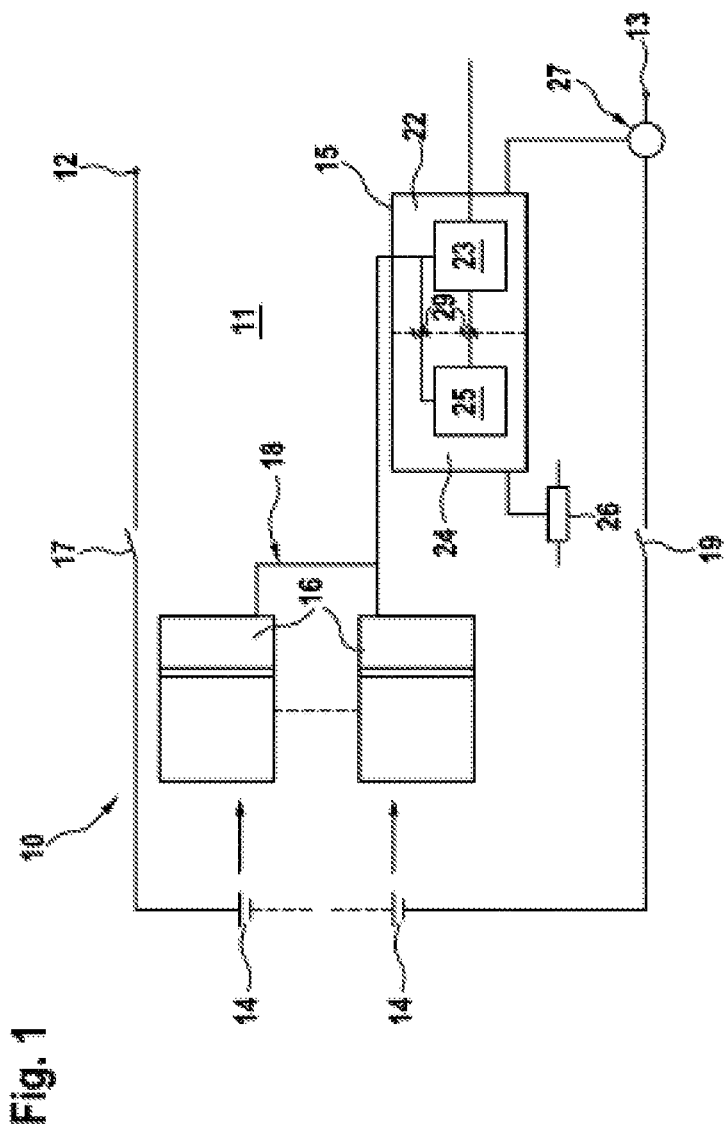
FIG. 1 shows a battery with a battery management system according to the prior art.
Figure 2:
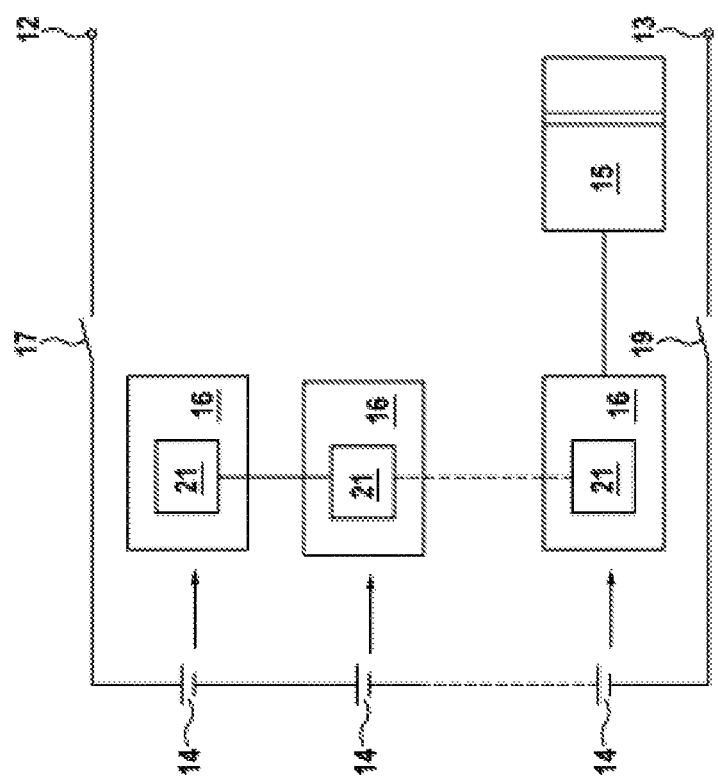
FIG. 2 shows a known daisy chain topology.
Figure 3:
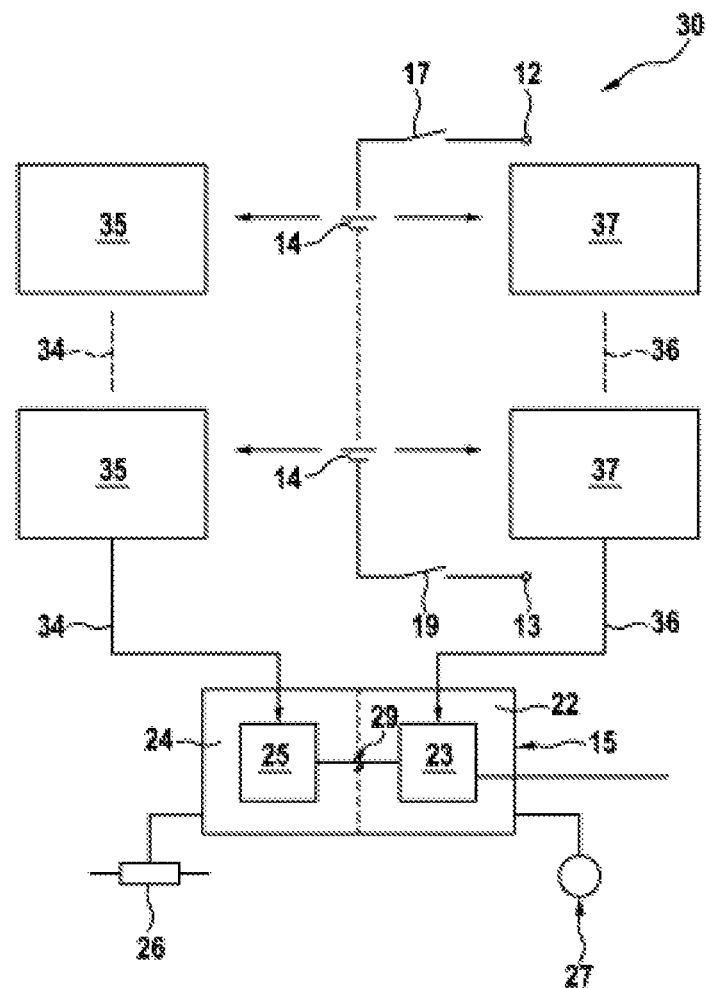
FIG. 3 shows a battery with a battery management system for monitoring battery cells of the battery according to an exemplary embodiment of the disclosure, the cells being monitored with a line of CSCs per microcontroller arranged in a controller.

FIG. 3 shows a battery system 30 according to the disclosure battery management system 31 for monitoring the battery cells 14 of the battery. In accordance with the embodiment shown in FIG. 3, the battery is set up to provide a voltage on the connections 12, 13 and/or to be charged via the connections 12, 13. The battery cells 14 may be grouped into battery modules. The battery cells 14 or the battery modules have associated CSCs 35, 37. The CSCs 35, 37 are connected to the battery cells 14 and are set up to monitor the battery cells 14, the battery cells 14 each being monitored in duplicate in the sense that two redundant lines of CSCs 35 and CSCS 37 are existent, as shown in FIG. 3. The CSCs 35, 37 are read and possibly actuated by a controller 15. Since the disclosure involves the cell modules being monitored in parallel by two respective CSCs 35, 37, increased redundancy and consequent increased functional reliability are existent. This allows a higher ASIL level to be achieved more easily without the need for the controller 15 to perform complex error possibility calculations in order to do so. The controller 15 has a high voltage side 24 and a low voltage side 22, which are each fitted with a redundant microcontroller 25, 23. The two sides 24, 22 are DC-decoupled from one another by means of isolation 29. In contrast to the prior art, the topology according to the disclosure involves the high voltage side 24 operating independently of the low voltage side 22. One line of CSCs 35 covers the high-voltage-side microcontroller 25, and the other line of CSCs 37 covers the low-voltage-side microcontroller 23 in parallel. The CSCs 35 connected to the high voltage side 24 are coupled by means of a first communication link 34, the CSCs 37 connected to the low voltage side 22 being coupled by means of a dedicated, second communication link 36. The communication by the separate CSC lines with the controller 15 can proceed optionally using CAN and CAN, that is to say by means of a CAN bus both on the high voltage side and on the low voltage side, using CAN and daisy chain, using daisy chain and CAN or using daisy chain and daisy chain. The data from the respective sides do not need to be synchronized to one another, since the capture takes place independently of one another in parallel. The high voltage side is equipped with a shunt 26, and the low voltage side is equipped with a Hall sensor 27, so that current measurement can take place independently of one another.

Figure 4:
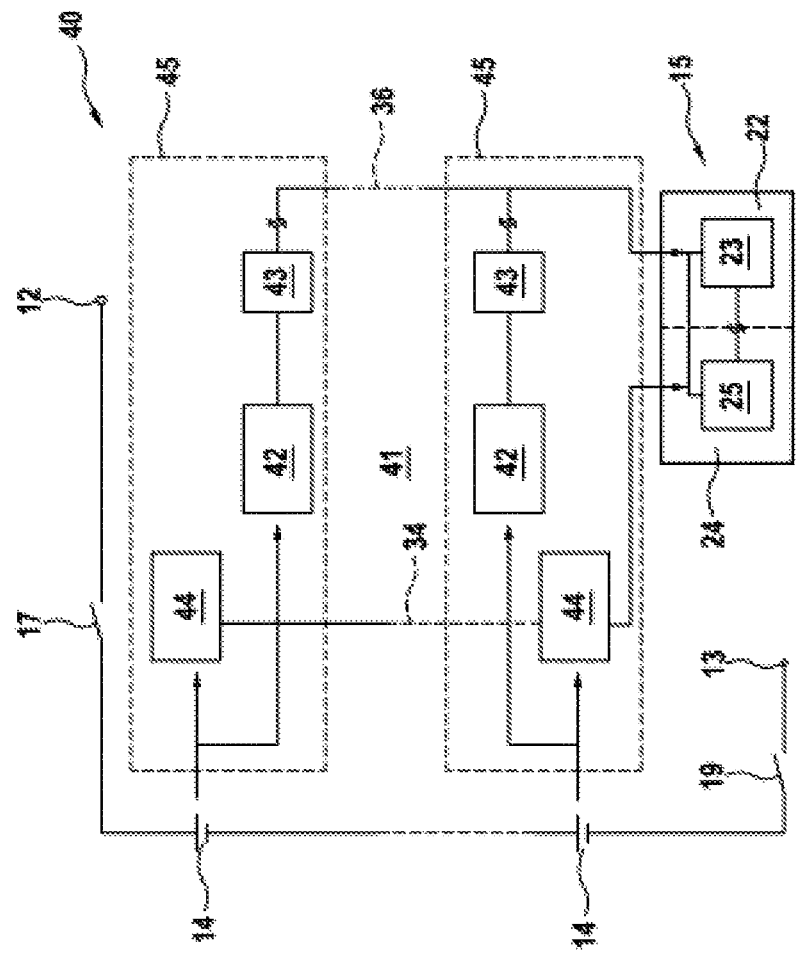
FIG. 4 shows a battery with a battery management system for monitoring battery cells of the battery in accordance with another exemplary embodiment of the disclosure, the cells being monitored with a combination of daisy chain and CAN bus communication.

An alternative variant embodiment is shown in FIG. 4. In accordance with the embodiment shown in FIG. 4, provision is made for two cell voltage measuring units 44, 42 that act independently of one another to be set up in a CSC 45. One line covers the high-voltage-side microcontroller 25 in the controller 15, and the other covers the low-voltage-side microcontroller 23 in parallel. Preferably, this involves the use of cell voltage measuring units 44, 42 from different manufacturers. For the communication, it is again possible to use aforementioned CAN/daisy chain combinations. As shown in FIG. 4, for each CSC 45, a respective cell monitoring microcontroller 43 is used that receives respective data from the cell voltage measuring units 44, 42 connected to the low-voltage-side microcontroller 23. In accordance with another embodiment, the cell monitoring microcontroller 43 is dispensed with.

A person skilled in the art can see that the present disclosure can involve numerous variations and modifications being made without departing from the scope of the disclosure. By way of example, although the present description describes the disclosure in respect of the connection to CAN or daisy chain buses, the disclosure is not limited thereto. Instead, other communication links are also possible. In addition, although it is pointed out that the disclosure is preferably used with lithium ion batteries, this is not intended to be a restriction of the protection. Instead, the disclosure can also be advantageously applied to other types of battery.

The invention claimed is:

1. A battery management system, comprising:
a plurality of first measuring units configured to capture a measured variable associated with at least one battery module of a battery;
a controller having a high voltage side and a low voltage side and including a first microcontroller and a second microcontroller, the first microcontroller being arranged on the high voltage side, the second microcontroller being arranged on the low voltage side, the high voltage side and the low voltage side being DC isolated from each other;
a first communication link configured to transmit the measured variable from the first measuring units to the first microcontroller;
a plurality of second measuring units configured to capture the measured variable from the at least one battery module of the battery; and
a second communication link configured to transmit the measured variable from the second measuring units to the second microcontroller, wherein the first microcontroller is programmed to evaluate the measured variable captured by the first measuring units,
wherein the second microcontroller is programmed to evaluate the measured variable captured by the second measuring units independently of the evaluation of the measured variable by the first microcontroller.

2. The battery management system as claimed in claim 1, wherein the first microcontroller is programmed to evaluate the measurement data captured by the first measuring units independently of the second microcontroller.

3. The battery management system as claimed in claim 1, wherein:
the first communication link is a CAN bus or the first measuring units are coupled by the first communication link in accordance with a daisy chain arrangement, and/or the second communication link is a CAN bus or the second measuring units are coupled by the second communication link in accordance with a daisy chain arrangement.

4. The battery management system as claimed in claim 1, wherein at least one of the first measuring units and the second measuring units are each connected to at least one of the first and the second communication link via a cell monitoring microcontroller.

5. The battery management system as claimed in claim 1, wherein:
a respective one of the first measuring units is arranged in a first cell monitoring unit and one of the second measuring units is arranged in a second cell monitoring unit, and
the second cell monitoring unit is coordinate with respect to the first cell monitoring unit, such that the first and second cell monitoring units are each coupled to the same battery modules of the battery.

6. The battery management system as claimed in claim 1, wherein:
a respective one of the first measuring units together with one of the second measuring units are arranged in a cell monitoring unit, and
the cell monitoring unit is configured to capture at least one further physical measured variable for the battery cells or battery modules in addition to the measured variables monitored by the first and second measuring units.

7. The battery management system as claimed in claim 1, wherein the battery management system is included in a battery.

8. The battery management system as claimed in claim 1, wherein the at least one measured variable is an electrical voltage.

9. The battery management system as claimed in claim 1, wherein:
the first measuring units of the plurality of first measuring units are configured to ascertain the at least one measured variable repeatedly and independently of the second measuring units of the plurality of second measuring units, and
the second measuring units of the plurality of second measuring units are configured to ascertain the at least one measured variable repeatedly and independently of the first measuring units of the plurality of first measuring units.

10. The battery management system as claimed in claim 1, wherein:
the first communication link is configured to transmit the at least one measured variable to the first microcontroller for the purpose of evaluation or processing, the first communication link exclusively associated with the plurality of first measuring units, and the first microcontroller exclusively associated with the plurality of first measuring units,
the second communication link is configured to transmit the at least one measured variable to the second microcontroller for the purpose of evaluation or processing, the second communication link exclusively associated with the plurality of second measuring units, and the second microcontroller exclusively associated with the plurality of second measuring units,
the first microcontroller evaluates or processes the at least one measured variable independently of the evaluation or processing of the at least one measured variable by the second microcontroller, and
the second microcontroller evaluates or processes the at least one measured variable independently of the evaluation or processing of the at least one measured variable by the first microcontroller.

11. The battery management system as claimed in claim 1, wherein the at least one measured variable is an electrical voltage.

12. A motor vehicle, comprising:
a drive system;
a battery connected to the drive system; and
a battery management system configured to monitor the battery, the battery management system including:
a plurality of first measuring units, each associated with at least one battery module of the battery, the first measuring units configured to capture at least one measured variable;
a controller including a first microcontroller and a second microcontroller;
a first communication link configured to transmit data between the first measuring units and the controller;
a plurality of second measuring units configured to capture the at least one measured variable from the battery modules of the battery and the at least one measured variable by the first measuring units; and
a second communication link configured to transmit data between the second measuring units and the controller,
wherein the first microcontroller is programmed to evaluate measurement data captured by the first measuring units, and the second microcontroller is programmed to evaluate measurement data captured by the second measuring units independently of the first microcontroller,
wherein the first microcontroller is arranged on a low voltage side of the controller and the second microcontroller is arranged on a high voltage side of the controller, and said sides are DC isolated from one another,
wherein the first measuring units cover the first microcontroller on the low-voltage side using a first line and the second measuring units cover the second microcontroller on the high voltage side using a second line.

13. The motor vehicle as claimed in claim 12, wherein the at least one measured variable is an electrical voltage.

* * * * *